(12) United States Patent
Chang et al.

(10) Patent No.: US 12,349,276 B2
(45) Date of Patent: Jul. 1, 2025

(54) CO-PLANAR INTERCONNECTION MECHANISMS FOR CIRCUIT BOARDS

(71) Applicant: Intel Corporation, Santa Clara, CA (US)

(72) Inventors: Mooi Ling Chang, Bayan Lepas (MY); Tin Poay Chuah, Bayan Baru (MY); Eng Huat Goh, Ayer Itam (MY); Min Suet Lim, Gelugor (MY); Twan Sing Loo, Butterworth (MY)

(73) Assignee: Intel Corporation, Santa Clara, CA (US)

( * ) Notice: Subject to any disclaimer, the term of this patent is extended or adjusted under 35 U.S.C. 154(b) by 627 days.

(21) Appl. No.: 17/671,566

(22) Filed: Feb. 14, 2022

(65) Prior Publication Data

US 2022/0174820 A1    Jun. 2, 2022

(51) Int. Cl.
| | |
|---|---|
| *H05K 1/14* | (2006.01) |
| *G06F 13/40* | (2006.01) |
| *H01R 12/51* | (2011.01) |
| *H05K 1/11* | (2006.01) |
| *H05K 1/18* | (2006.01) |

(52) U.S. Cl.
CPC ......... *H05K 1/141* (2013.01); *G06F 13/4022* (2013.01); *G06F 13/4068* (2013.01); *H01R 12/51* (2013.01); *H05K 1/115* (2013.01); *H05K 1/183* (2013.01); *H05K 2201/10189* (2013.01)

(58) Field of Classification Search
CPC ......... H05K 1/141; H05K 1/142; H05K 1/183
See application file for complete search history.

(56) References Cited

U.S. PATENT DOCUMENTS

| | | | |
|---|---|---|---|
| 2017/0062959 A1* | 3/2017 | Schrader | H01R 4/28 |
| 2017/0188461 A1* | 6/2017 | Wong | H05K 1/142 |
| 2019/0013603 A1* | 1/2019 | Azad | H01R 12/57 |

\* cited by examiner

*Primary Examiner* — Sherman Ng
(74) *Attorney, Agent, or Firm* — Alliance IP, LLC

(57) ABSTRACT

In one embodiment, a system includes a first circuit defining recesses along an edge of the first circuit board, and a second circuit board defining fins extending from at least one outer edge of the second circuit board. The fins of the second circuit board are positioned within the recesses of the second circuit board to connect the circuit boards in a co-planar manner. The fins and recesses may be shaped to provide an interlocking connection of the first and second circuit boards in the co-planar direction.

22 Claims, 12 Drawing Sheets

CO-PLANAR INTERCONNECTION MECHANISMS FOR CIRCUIT BOARDS

TECHNICAL FIELD

This disclosure relates in general to the field of computer systems and, more particularly, to co-planar interconnection mechanisms for circuit boards.

BACKGROUND

Circuit boards may be interconnected using various types of connectors (e.g., M.2 connectors). However, these connectors present certain issues. For example, M.2 connectors may introduce signal integrity loss for high-speed input/output (HSIO) signals, such as with signals provided for wireless wide area network (WWAN) connection cards. Further, such connectors can increase the overall size of the system that includes the circuit boards connected via an M.2 connector.

BRIEF DESCRIPTION OF THE DRAWINGS

Like reference numbers and designations in the various drawings indicate like elements.

DETAILED DESCRIPTION OF EXAMPLE EMBODIMENTS

Figure 1:
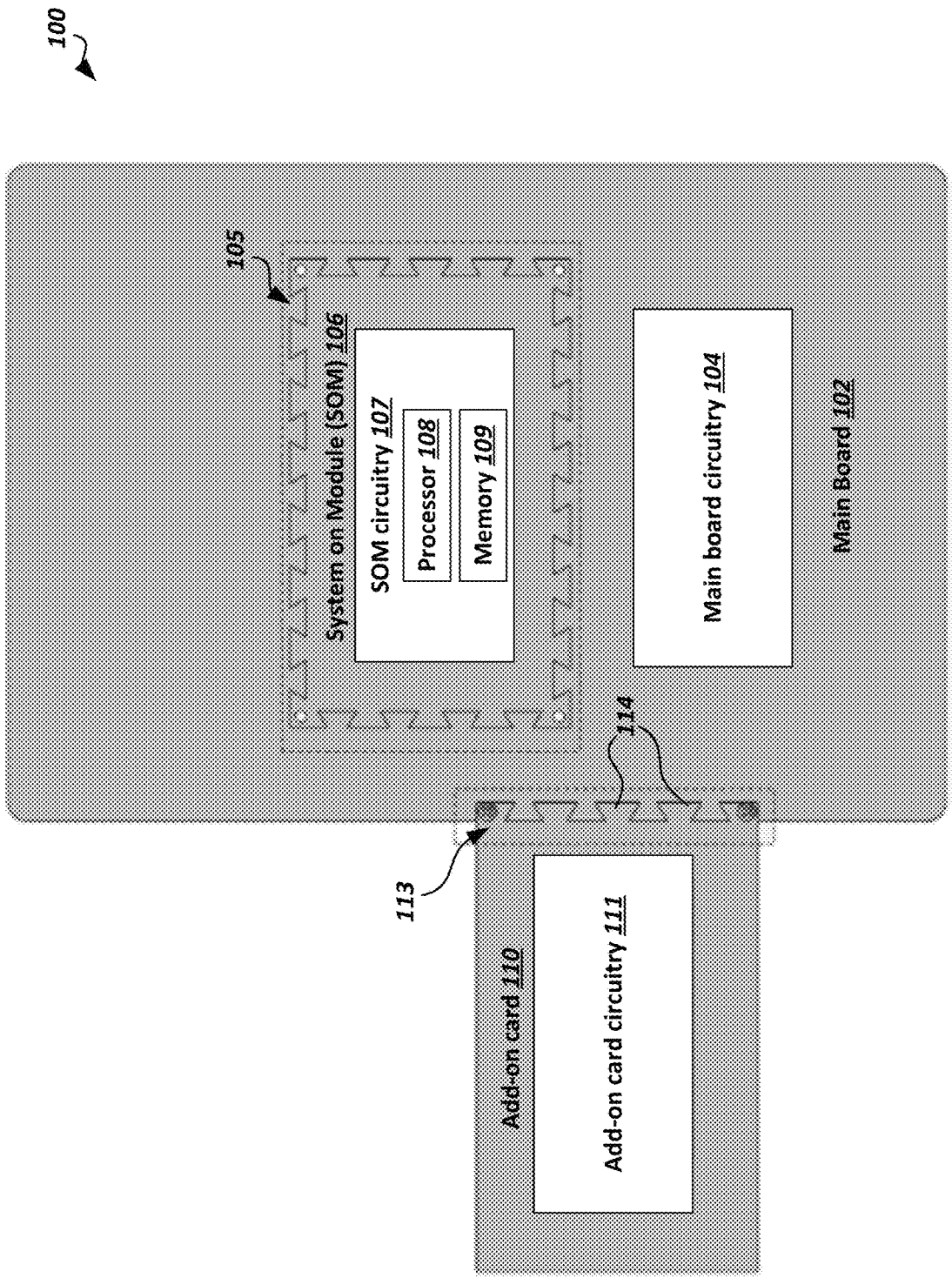
FIG. 1 illustrates an example system that includes co-planar board-to-board interconnection mechanisms in accordance with embodiments of the present disclosure.

In the following description, numerous specific details are set forth, such as examples of specific configurations, structures, architectural details, etc. in order to provide a thorough understanding of the present disclosure. It will be apparent, however, to one skilled in the art that these specific details need not be employed to practice embodiments of the present disclosure. In some instances, well known components or methods may be utilized, and such details haven't been described in detail in order to avoid unnecessarily obscuring embodiments of the present disclosure.

Circuit boards may be interconnected using various types of connectors (e.g., M.2 connectors). However, these connectors present certain issues. For example, M.2 connectors may introduce signal integrity loss for high-speed input/output (HSIO) signals, such as with signals provided for wireless wide area network (WWAN) connection cards. Further, such connectors can increase the overall size of the system that includes the circuit boards connected via an M.2 connector.

Some solutions that have attempted to address these issues have included the addition of retimers or using a low-loss PCB material to "buy back" signal integrity. However, these solutions may increase the cost of the bill of materials (BOM) for the system. Others solutions have used sintered paste interconnects or a direct solder down approach to connect different boards to reduce the overall area of the connected system. While these solutions may reduce the area, they still have a negative impact on the height of the system (i.e., still add height to the overall system). Further, with the solder down approaches, the ability to scale across different board designs may be lost, as each soldered down solution may require a dedicated board certification per board design and may present difficulties in serviceability etc.

Aspects of the present disclosure provide co-planar board-to-board connection mechanisms that eliminate the need for M.2 connectors (or similar types of connectors), providing better signal integrity and overall board area reductions (e.g., in the x-, y-, and/or z-directions) when compared with previous solutions. Embodiments herein may accordingly enable system-on-module (SoM) as a plug-and-play solution that does not require a solder down using a ball grid array (BGA) or socket on a line grid array (LGA) package.

The connection mechanisms of the present disclosure may provide an interlocking connection between two circuit boards, with fins extending from one or more edges of a board (e.g., an add-on board or system on module (SOM) board) designed to fit within recesses of another board (e.g., a main board of a system, such as a motherboard). The fins/recesses may be any suitable shape, such as dovetails/trapezoids/circles in certain instances. This design may have the advantage of not needing to be secured separately in the x and y directions in a resting position, and may accordingly create a high precision alignment for both boards. This can be implemented in any location of the board such as middle of the board and side of the board. The electrical connections between the boards may be provided by gold finger traces, PCBeam™ connectors, or soldered PTH/pads that are embedded in the recesses. These connectors can be arranged to provide various types of interconnects, e.g., Peripheral Component Interconnect Express (PCIe) Gen5 differential pairs, and may be especially advantageous for certain types of add-on cards or modules, e.g., wireless wide area network (WWAN) modem modules. Other technical advantages may include better signal integrity through the elimination of traditional connectors, removing loss induced by the connector and reducing the number of micro via/plated through hole (PTH) transitions. PTH stubs which induce signal reflection can be also reduced in certain embodiments, which may provide additional signal integrity.

In addition, package and platform miniaturization may be achieved through overall board XYZ reduction from the elimination of board-to-board connectors, such as M.2 connectors. For example, in some embodiments, platform Z height may be reduced by approximately ~28% from 2.9 mm to 2.1 mm, enabling a thinner system stack-up for premium, sleek form factors. The removal of the board-to-board connectors may also reduce ~9 mm from the total board length in certain instances, allowing for larger battery capacities or allowing for increased feature-sets to be placed in the system. Further, embodiments herein may provide for cheaper boards, e.g., by replacing costly RIMB solutions created by laser routing and replacing those with HIMB (Hole in Motherboard) solutions before attaching the module piece with single sided processes. Still further, some embodiments may allow for increased modularity of add-on cards, such as WWAN modules as described above, without the need for a ball grid array (BGA) or socket connection. Rather, embodiments may provide a plug-and-play solution with a simple, highly scalable module to mainboard interconnect mechanism, reducing the surface mount technology (SMT) complexity.

Embodiments herein may also provide the following manufacturing advantages. Forming the interconnects described herein may be included as part of current fabrication techniques using a laser router (to cut the fin shape) and relief process (to create the recess in which the fins will fit). The process comes with high accuracy laser router machine and laser stop design, while the contact pad registration is currently at +/−25 μm or less. This may be sufficient to address the mating tolerance requirement where the pad size will come with a size of ~250 um-400 um, with pitch of 0.4-1 mm. Interconnect media used, ACF (Anisotropic Conductive Film), solder paste, conductive via plug and PCBeam™ are existing ready technology use in high volume manufacturing (HVM).

FIG. 1 illustrates an example system 100 that includes co-planar board-to-board interconnection mechanisms in accordance with embodiments of the present disclosure. The example system 100 includes a main circuit board 102, a system on module (SOM) circuit board 106 connected to the main circuit board 102 via a first co-planar interconnection mechanism 105, and an add-on card circuit board 110 connected to the main circuit board 102 via a second co-planar interconnection mechanism 113.

The SOM 106 includes SOM circuitry 107 to implement one or more functions provided by the SOM. In some embodiments, the SOM circuitry 107 may include one or more processors 108 (e.g., the processor 900 of FIG. 9, processors 1070, 1080 of FIG. 10) of various types (e.g., a central processing unit (CPU), a graphical processing unit (GPU), a field programmable gate array (FPGA), an accelerator, etc.) and/or memory 109 (e.g., memory elements 1032, 1034 of FIG. 10). The memory 109 may include volatile and/or non-volatile memory. The add-on card circuit board 110 includes add-on card circuitry 111 to implement one or more functions of the add-on card 110. In some instances, the add-on card 110 may be implemented similar to the I/O devices 1016 of FIG. 10. In some embodiments, the add-on card circuitry may include a processor and/or memory similar to the SOM 106. For instance, the add-on card may be a solid state storage device (SSD), Small Outline Dual In-line Memory Module (SODIMM), wireless wide area network (WWAN) connector with WWAN processors, radios, etc.

The main circuit board 102 includes various circuitries 104 that may connect to the SOM 106 and/or the add-on card 110 through the interconnection mechanisms 105, 113. In the example shown, the SOM 106 connects to the main board 102 on all of its outer edges, while the add-on card 110 connects to the main board at one outer edge.

The circuit boards implementing the co-planar interconnection mechanisms of the present disclosure may have what is considered to be a main portion that includes the circuitry of the board (e.g., the portion of the add-on card board 110 that includes the circuitry 111). The boards may define fins (e.g., 114) that extend outward from the main portion of the circuit board. As is shown in certain figures (e.g., FIGS. 2A, 3A, 7A-7B), the fins may have a thickness that is less than the thickness of the main portion of the circuit board, and the fins may share a top/bottom surface with circuit board (e.g., the top surface of the fin is the same as the top surface of the main portion of the circuit board). While the example co-planar interconnection mechanisms 105, 113 each include trapezoidal shaped interlocking fins, other types of fin shapes may be used, e.g., circular fins as shown in FIGS. 5-6 or rectangular fins or oval fins.

Another board (e.g., the main board 102) may define recesses that are shaped such that the fins described above fit within the recesses. The recesses may accordingly have a thickness that is less than the thickness of the main portion of the circuit board. In some embodiments, the thicknesses of the two circuit boards to be connected (e.g., the add-on circuit board 110 and the main board 102) may have the same or similar thickness, and the thicknesses of the fins and the recesses may together equal or approximately equal the thickness of each of the circuit boards. This may allow the fins of one board to fit within the recesses of the other such that the boards are connected together in a co-planar manner with little to no additional thickness in the z-direction.

Figure 2A:
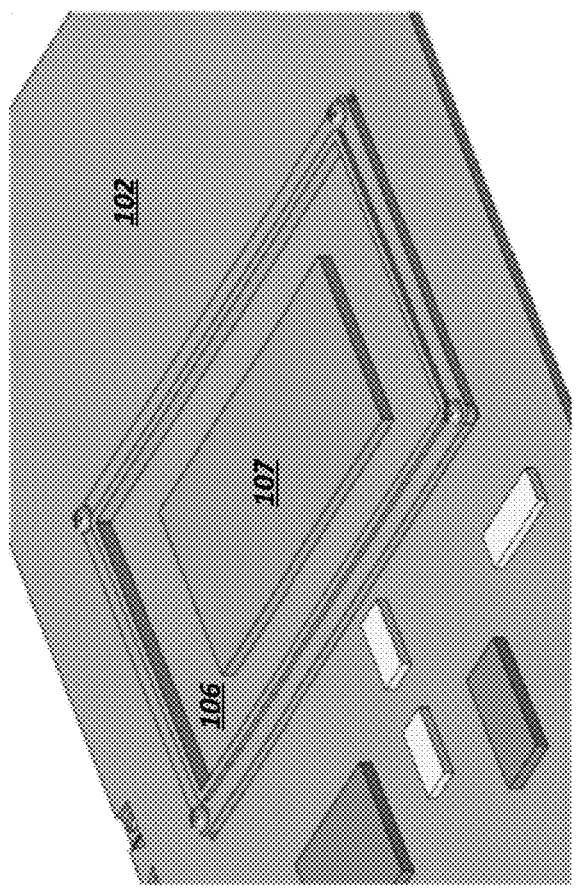
FIGS. 2A-2B illustrate perspective views of the co-planar interconnection between the main board and the SOM board of FIG. 1, before and after being connected, in accordance with embodiments of the present disclosure.
Figure 2B:
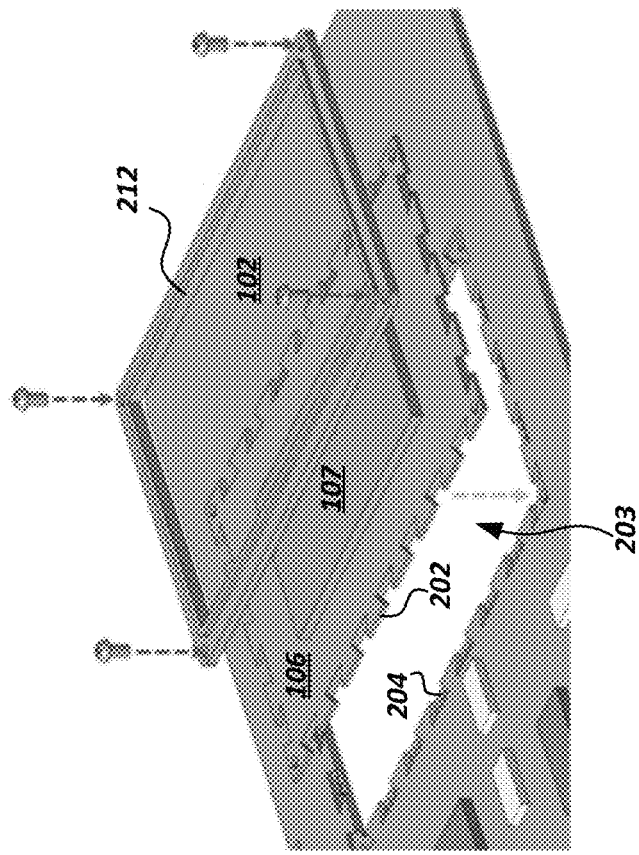

FIGS. 2A-2B illustrate perspective views of the co-planar interconnection between the main board 102 and the SOM board 106 of FIG. 1, before and after being connected, in accordance with embodiments of the present disclosure. As shown in FIG. 2A in particular, the mechanism for the board-to-board connection between the main board 102 and the SOM board 106 consists of fins 202 (trapezoidal shaped in this example) that extend from the main portion of the SOM board 106 and recesses 204 defined along edges of an opening 203 in the main board 102 that receive the fins 202 when connected. In some embodiments, to allow for a co-planar or substantially co-planar connection between the boards, the fins 202 have a thickness that is less than the total thickness of the main SOM board 106. For example, the fins 202 may be a subset of layers of the total number of layers in the SOM board 106. The fins 202 may include one or more electrical connectors that connect to connectors within the respective recesses 204 of the main board 102. Example connector types that may be used include PCBeam™ connectors (or similar types of connectors that have angled pins embedded into the board during fabrication and extend upward similar to the pins 412 shown in FIG. 4A), metal finger traces (e.g., 422 of FIG. 4B), solder pads, and/or plated through hole (PTH) vias (e.g., 432 of FIG. 4C). In addition, FIGS. 2A-2B illustrate an example plate 212 that may be placed on top of the fins 202 and secured to the main board (e.g., via screws as shown, with threads in the main board 102) to prevent the SOM board 106 from disconnecting from the main board 102.

Figure 3A:
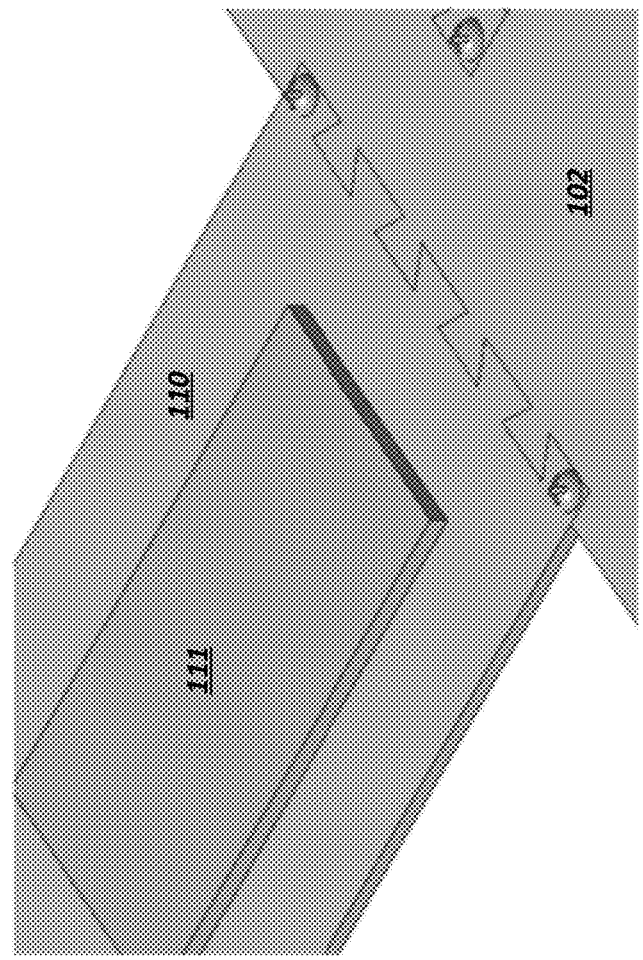
FIGS. 3A-3B illustrate perspective views of the co-planar interconnection between the main board and the add-on card of FIG. 1, before and after being connected, in accordance with embodiments of the present disclosure.
Figure 3B:
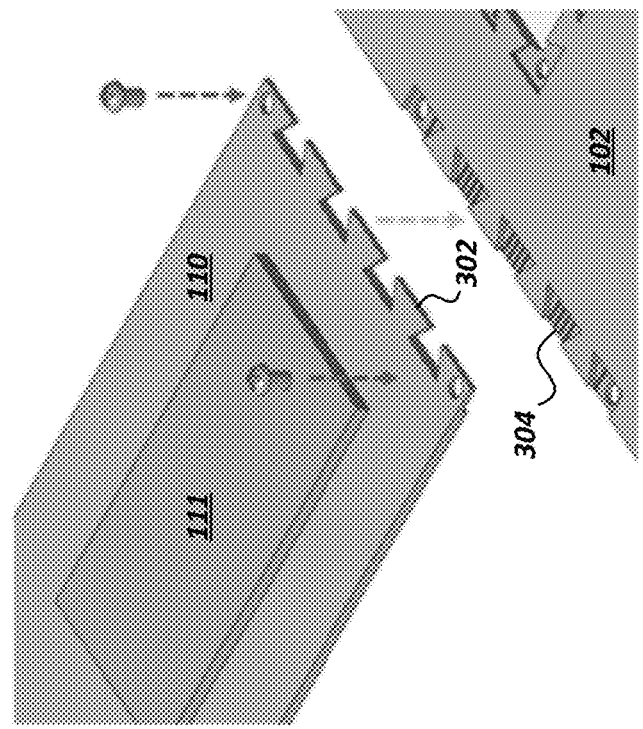
Figure 4C:
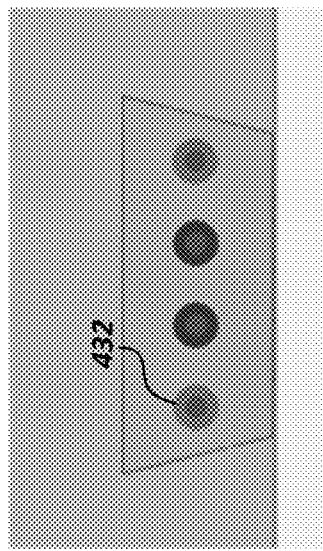
FIGS. 4A-4C illustrate example electrical connection mechanisms that may be incorporated into the co-planar interconnection mechanisms according to embodiments of the present disclosure.
Figure 4B:
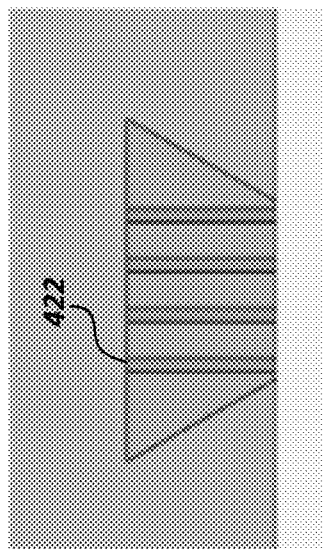
Figure 4A:
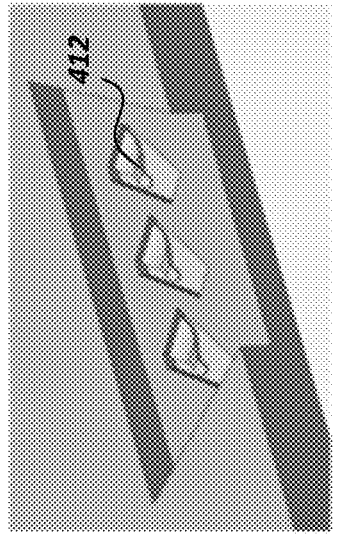

FIGS. 3A-3B illustrate perspective views of the co-planar interconnection between the main board 102 and the add-on card 110 of FIG. 1, before and after being connected, in accordance with embodiments of the present disclosure. As in the example shown in FIG. 2A, the mechanism for the board-to-board connection between the main board 102 and the add-on card board 110 consists of fins 302 (also trapezoidal shaped in this example) that extend from the main portion of the add-on card board 110 and recesses 304 within the main board 102 that receive the fins 302 when connected. In some embodiments, to allow for a co-planar or substantially co-planar connection between the boards, the fins 302 have a thickness that is less than the total thickness of the main add-on card board 110. For example, the fins 302 may be a subset of layers of the total number of layers in the add-on card board 110. The fins 302 may include one or more electrical connectors that connect to connectors within the respective recesses 304 of the main board 102. Example connector types that may be used include PCBeam™ connectors (or similar types of connectors that have angled pins embedded into the board during fabrication and extend upward similar to the example shown in FIG. 4A), metal finger traces (e.g., as shown in FIG. 4B), solder pads, and/or plated through hole (PTH) vias (e.g., as shown in FIG. 4C). In some embodiments, a plate similar to the plate 212 of FIGS. 2A-2B may be placed on top of the fins 302 and secured to the main board to prevent the add-on card board 110 from disconnecting from the main board 102.

Figure 5B:
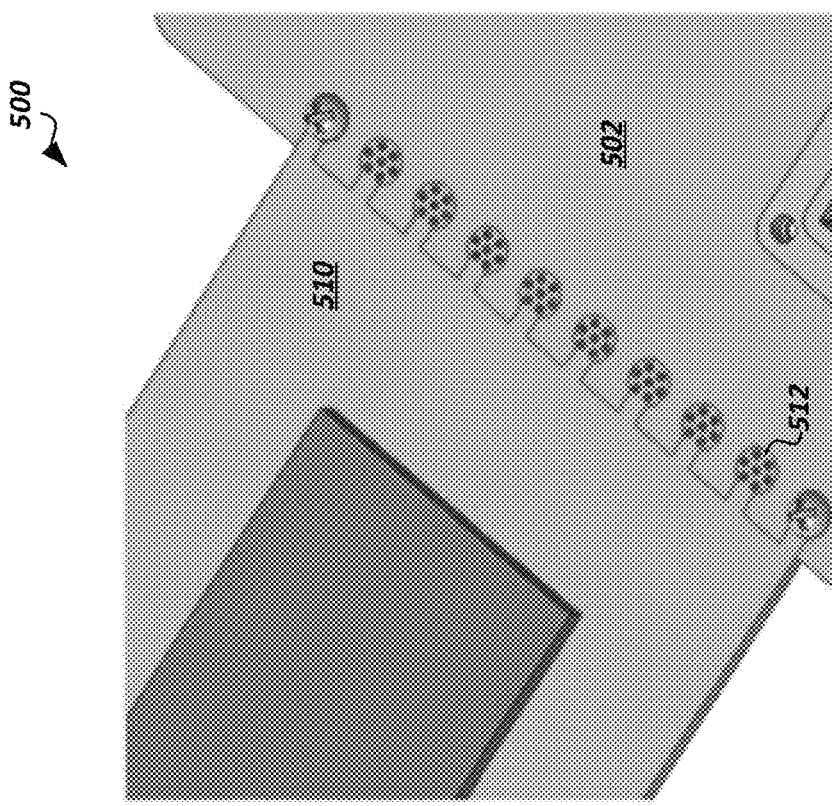
FIGS. 5A-5C illustrate another example system that includes co-planar board-to-board interconnection mechanisms in accordance with embodiments of the present disclosure
Figure 5A:
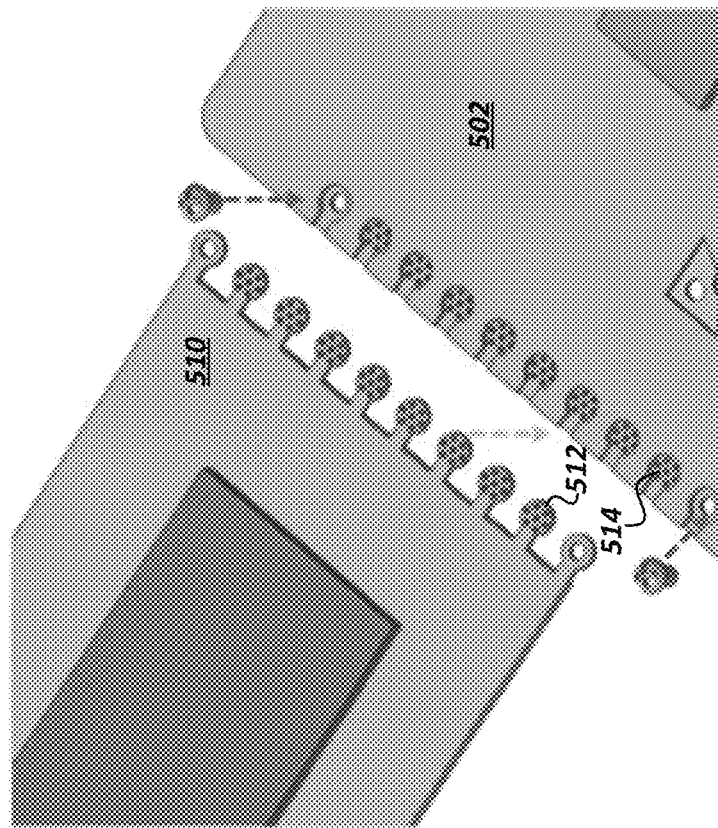
Figure 5C:
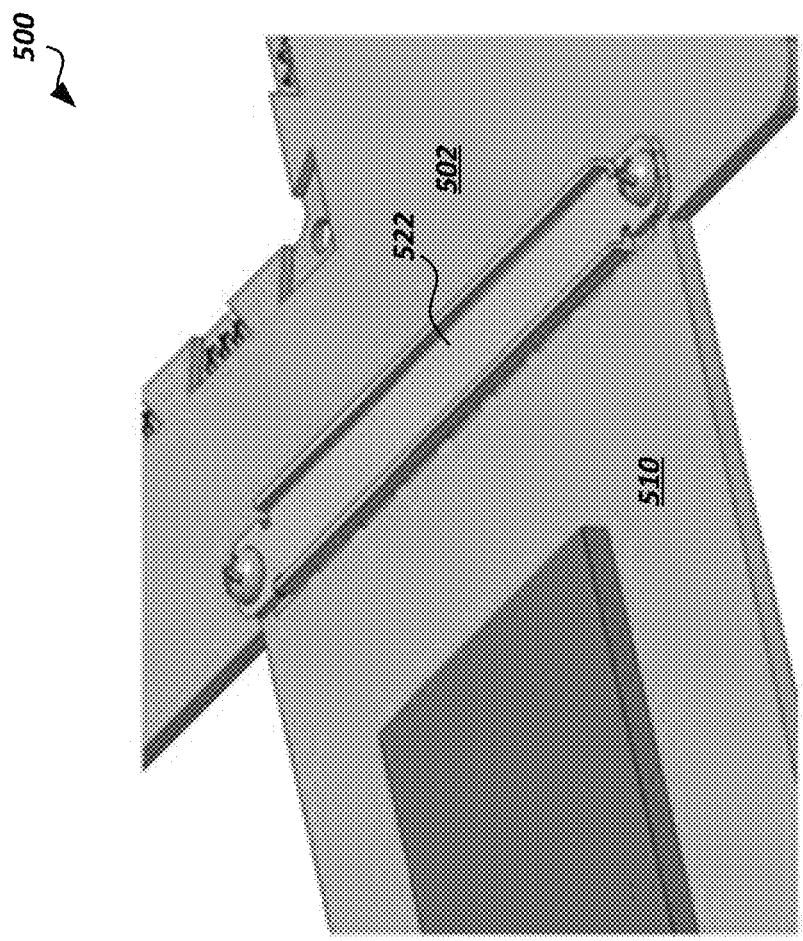

FIGS. 5A-5C illustrate another example system 500 that includes co-planar board-to-board interconnection mechanisms in accordance with embodiments of the present disclosure. The example system 500 is implemented similar to the system 100 of FIG. 1. For instance, the example system 500 includes an add-on card 510 (which may be implemented in the same or similar manner as the add-on card 110 of FIG. 1) connected to a main board 502 (which may be implemented in the same or similar manner as main board 102 of FIG. 1) using circular fins 512 of the add-on card 510 that fit within recesses 514 of the main board 502 in a similar manner as described above. The fins 512 may include any suitable electrical connector type(s) for providing the electrical connections between the boards, and may include one or more of the example connector types shown in FIGS. 4A-4C. In the example shown, the fins 512 include PTH connectors. In addition, the example system 500 may include a plate 522 similar to the plate 212 of FIGS. 2A-2B that is placed on top of the fins 512 and secured to the main board to prevent the add-on card board 110 from disconnecting from the main board 102.

Figure 6D:
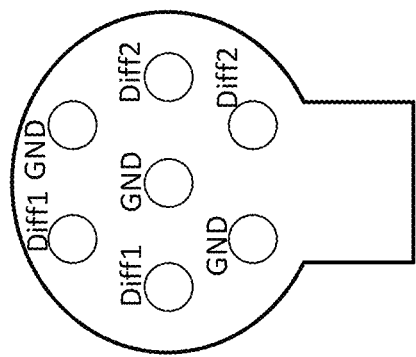
FIGS. 6A-6D illustrates example pin-out configurations for the fins or recesses of the co-planar interconnection mechanisms of the present disclosure.
Figure 6C:
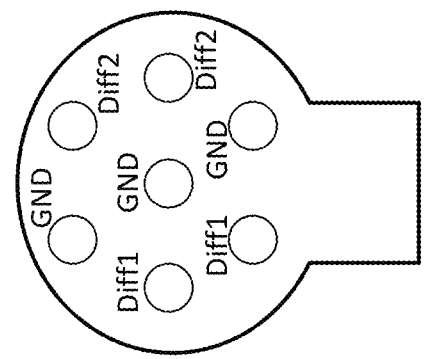
Figure 6B:
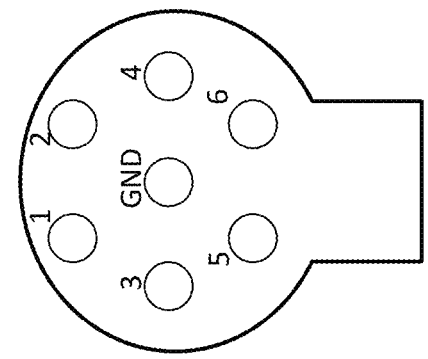
Figure 6A:
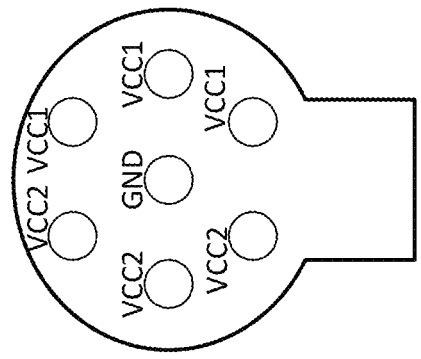

FIGS. 6A-6D illustrates example pin-out configurations for the fins or recesses of the co-planar interconnection mechanisms of the present disclosure. In each example, the fin/recess includes seven electrical connectors; however, certain embodiments may include additional or fewer connections. FIG. 6A illustrates an example dual power plane connector configuration with three connectors being connected to a first power plane of the circuit board, three connectors being connected to a second power plane of the circuit board, and a middle connector being connected to a ground plane of the circuit board. FIG. 6B illustrates an example single ended pin-out configuration wherein the middle connector is connected to a ground plane and every other connector is connected to a different connection or trace within the circuit board. FIGS. 6C-6D illustrate example differential pair configurations wherein one pair of connectors is dedicated to a first differential pair signal of the circuit board, another pair of connectors is dedicated to a second differential pair signal of the circuit board, and the three remaining connectors are connected to a ground plane of the circuit board. Each of these types of pin-out configurations may be utilized to implement a Peripheral Component Interconnect Express (PCIe)-compatible connection between two circuit boards.

Figure 7A:
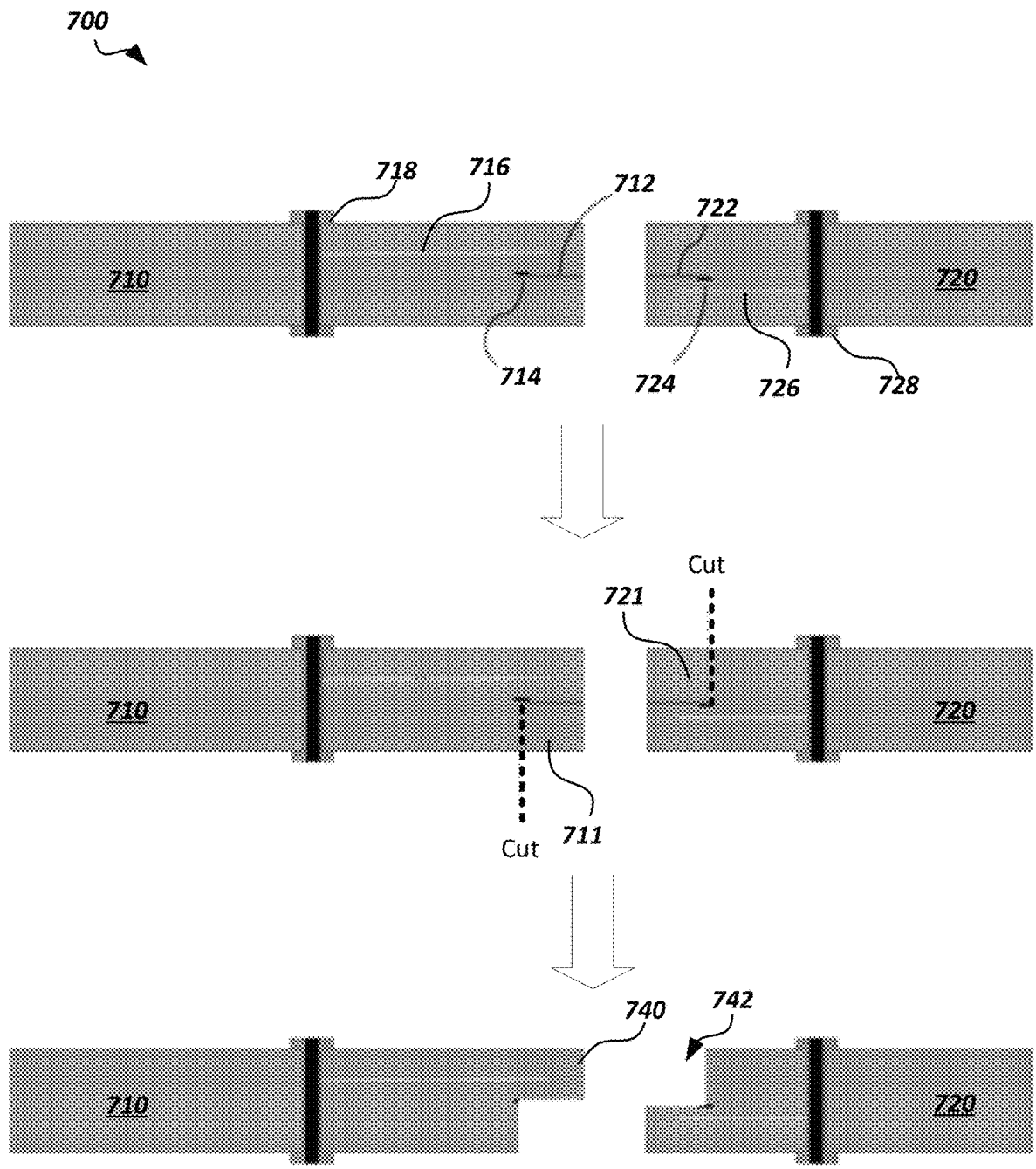
FIGS. 7A-7B illustrate an example fabrication process for co-planar interconnection mechanisms of the present disclosure.
Figure 7B:
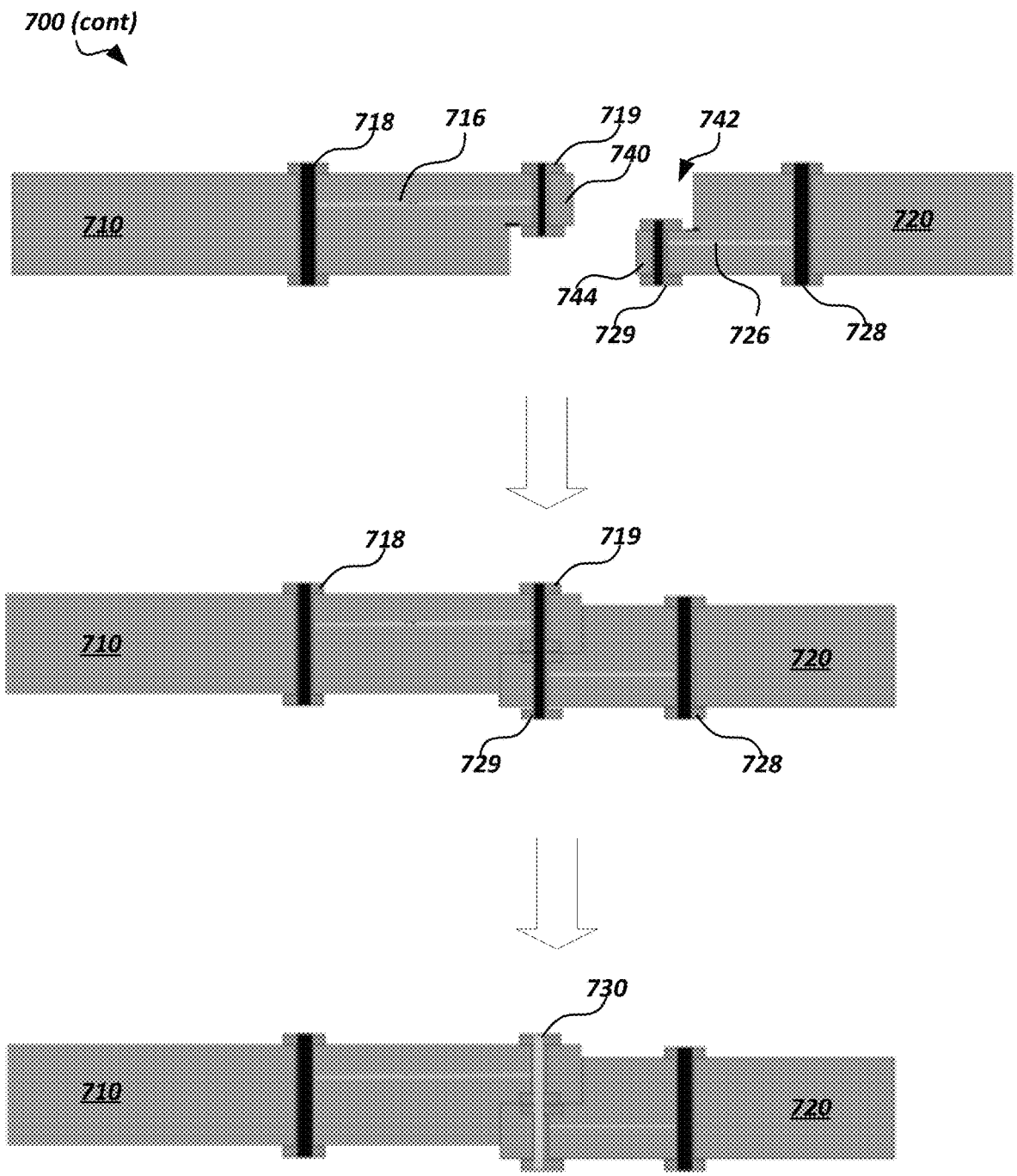

FIGS. 7A-7B illustrate an example fabrication process 700 for co-planar interconnection mechanisms of the present disclosure. Although shown from the side view, it will be understood that the placement of the laser stops, relief sheets, and the laser cutting is done in each respective board to cause a predetermined shape of fins/recesses, e.g., circular, trapezoidal, etc. Further, it will be understood that additional, fewer, or different operations may be performed than those shown in FIGS. 7A-7B to fabricate boards with the co-planar interconnection mechanisms of the present disclosure.

In the example shown, a first board 710 (e.g., an add-on card circuit board) has been previously fabricated to include a PTH 718, a trace 716 connected to the PTH 718, a relief sheet 712 that extends from a location inside the board 710 to an outer edge of the board 710, and a laser stop 714 positioned adjacent the inside portion of the relief sheet 712. A second board 720 (e.g., a matin board) includes a PTH 728 connected to an electrical trace 726 inside the board 720, similar to the PTH 718 and trace 716 of the first board 710. The second board also includes a relief sheet 722 and a laser stop 724 similar to the relief sheet 712 and laser stop 714 of the first board.

As shown in FIG. 7A, laser cuts are made to the respective boards (from opposite sides relative to one another, e.g., from the bottom of the board 710 and the top of the board 720), and the laser cutting is stopped by the laser stops within the respective boards. When the laser cutting hits the laser stops, the relief sheets within the respective boards cause the portions 711, 721 to fall away as shown, resulting in the fins (e.g., 740) of the first board 710 and the recesses (e.g., 742) of the second board 720.

Turning to FIG. 7B, a PTH 719 is formed in the fin 740 of the board 710 such that the PTH 719 connects to the trace 716 inside the board, and thus, the PTH 718. In addition, a PTH 729 is formed in the remaining portion 744 of the board 720 that defines the recess 742. The PTH 729 is formed such that it connects to the trace 726 within the board 720, and thus, to the PTH 728. The boards 710, 720 can then be connected as shown, causing the PTHs 719, 729 to contact each other and thus, causing the PTHs 718, 728 to be electrically connected to one another. In some embodiments, the inner openings of the PTHs 719, 729 may be filled with a conductive plug/filling 730 as shown, e.g., to interconnect top and bottom layers of the boards 710, 720 where needed.

Figure 8A:
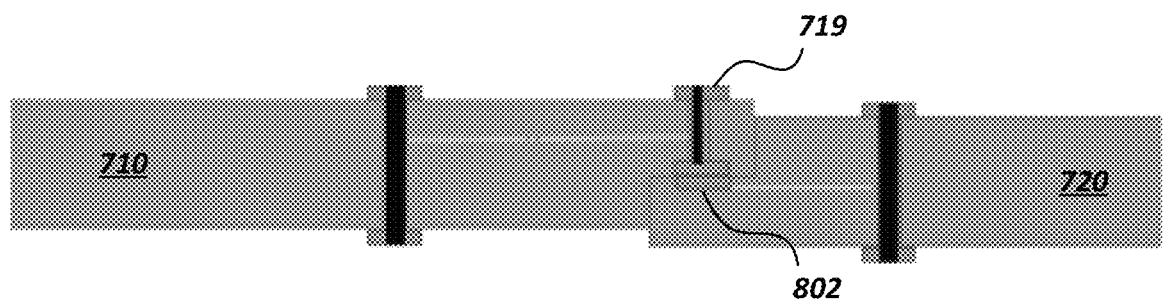
FIGS. 8A-8B illustrate example interconnect options that may be used in co-planar interconnection mechanisms of the present disclosure.
Figure 8B:
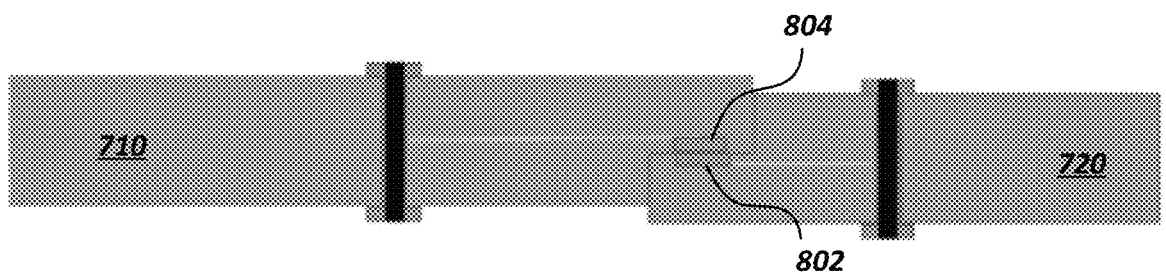

FIGS. 8A-8B illustrate example interconnect options that may be used in co-planar interconnection mechanisms of the present disclosure. In particular, FIG. 8A shows a metal pad 802 (e.g., a solder pad or similar type of connector) in place of PTH 729 of the second board 720 and connected to the PTH 718 of the first board 710. FIG. 8B shows an embodiment using metal pads 802, 804 (e.g., a solder pad or similar type of connector) in place of the PTHs 719, 729, respectively. The examples shown in FIGS. 8A-8B may remove number of PTHs needed in the boards and accordingly eliminate parasitic loss induced from the interconnection mechanisms. In addition, the examples shown may also remove one or more PTH stubs from Type3 boards.

Figure 9:
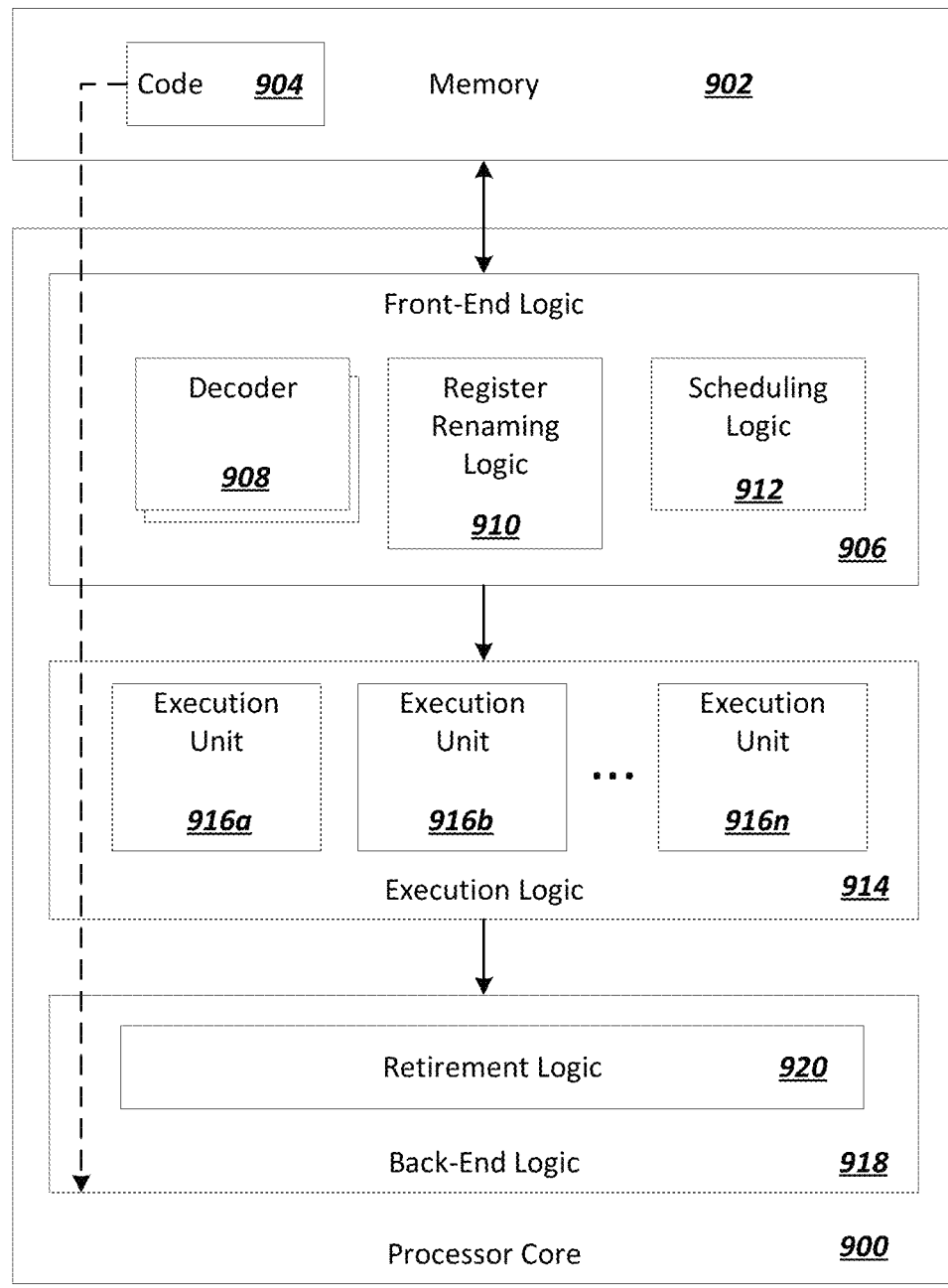
FIG. 9 is an example illustration of a processor according to an embodiment.
Figure 10:
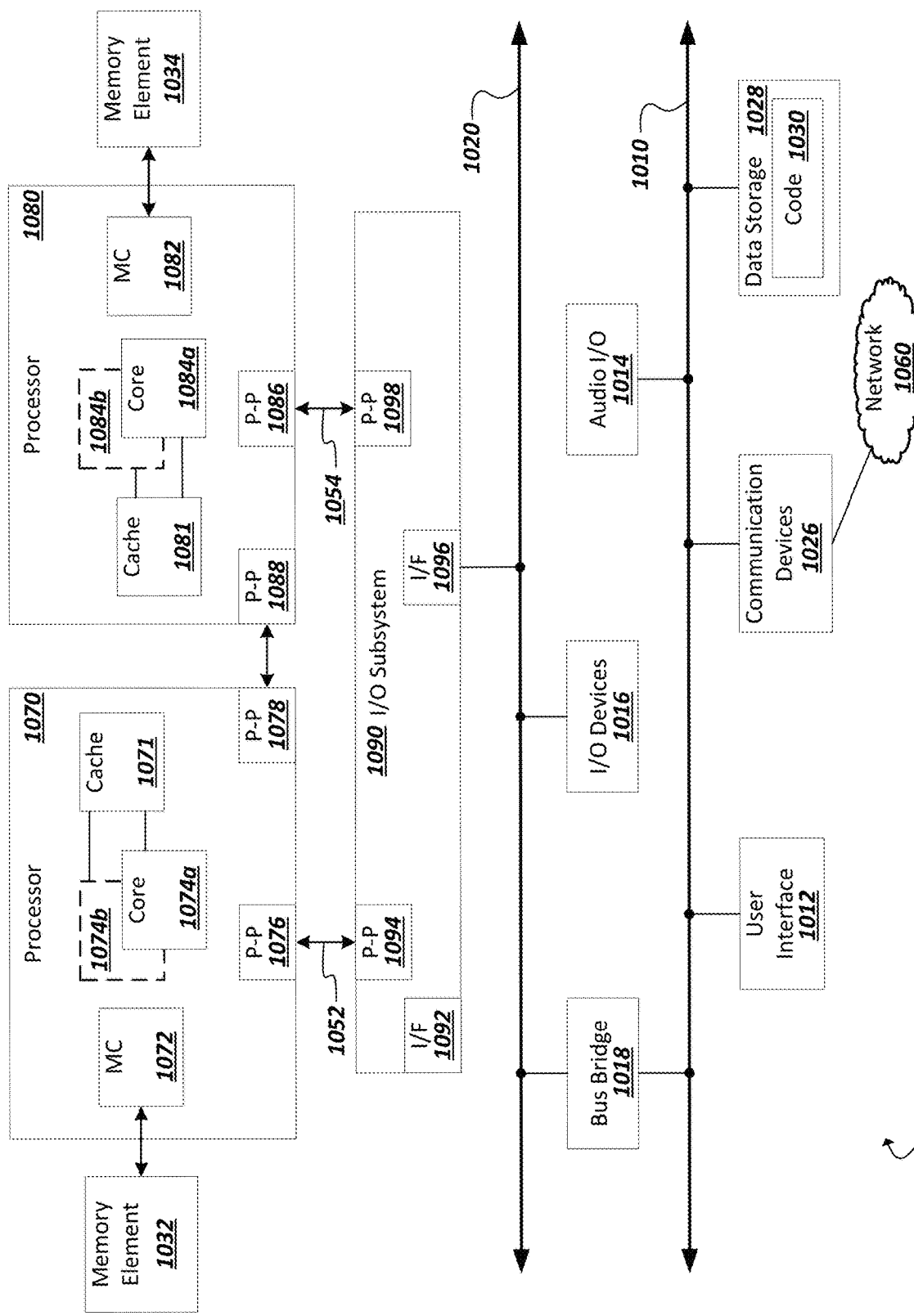
FIG. 10 illustrates a computing system that is arranged in a point-to-point (PtP) configuration according to an embodiment.

FIGS. 9-10 are block diagrams of example computer architectures that may be used in embodiments disclosed herein. For example, in some embodiments, a computer system may contain one or more aspects shown in FIGS. 9-10 and may implement one or more aspects of the present disclosure described above. Other computer architecture designs known in the art for processors and computing systems may also be used. Generally, suitable computer architectures for embodiments disclosed herein can include, but are not limited to, configurations illustrated in FIGS. 9-10.

FIG. 9 is an example illustration of a processor according to an embodiment. Processor 900 is an example of a type of hardware device that can be used in connection with the implementations above. Processor 900 may be any type of processor, such as a microprocessor, an embedded processor, a digital signal processor (DSP), a network processor, a multi-core processor, a single core processor, or other device to execute code. Although only one processor 900 is illustrated in FIG. 9, a processing element may alternatively include more than one of processor 900 illustrated in FIG. 9. Processor 900 may be a single-threaded core or, for at least one embodiment, the processor 900 may be multi-threaded in that it may include more than one hardware thread context (or "logical processor") per core.

FIG. 9 also illustrates a memory 902 coupled to processor 900 in accordance with an embodiment. Memory 902 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 900 can execute any type of instructions associated with algorithms, processes, or operations detailed herein. Generally, processor 900 can transform an element or an article (e.g., data) from one state or thing to another state or thing.

Code 904, which may be one or more instructions to be executed by processor 900, may be stored in memory 902, or may be stored in software, hardware, firmware, or any suitable combination thereof, or in any other internal or external component, device, element, or object where appropriate and based on particular needs. In one example, processor 900 can follow a program sequence of instructions indicated by code 904. Each instruction enters a front-end logic 906 and is processed by one or more decoders 908. The decoder may generate, as its output, a micro operation such as a fixed width micro operation in a predefined format, or may generate other instructions, microinstructions, or control signals that reflect the original code instruction. Front-end logic 906 also includes register renaming logic 910 and scheduling logic 912, which generally allocate resources and queue the operation corresponding to the instruction for execution.

Processor 900 can also include execution logic 914 having a set of execution units 916a, 916b, 916n, etc. Some embodiments may include a number of execution units dedicated to specific functions or sets of functions. Other embodiments may include only one execution unit or one execution unit that can perform a particular function. Execution logic 914 performs the operations specified by code instructions.

After completion of execution of the operations specified by the code instructions, back-end logic 918 can retire the instructions of code 904. In one embodiment, processor 900 allows out of order execution but requires in order retirement of instructions. Retirement logic 920 may take a variety of known forms (e.g., re-order buffers or the like). In this manner, processor 900 is transformed during execution of code 904, at least in terms of the output generated by the decoder, hardware registers and tables utilized by register renaming logic 910, and any registers (not shown) modified by execution logic 914.

Although not shown in FIG. 9, a processing element may include other elements on a chip with processor 900. For example, a processing element may include memory control logic along with processor 900. The processing element may include I/O control logic and/or may include I/O control logic integrated with memory control logic. The processing element may also include one or more caches. In some embodiments, non-volatile memory (such as flash memory or fuses) may also be included on the chip with processor 900.

FIG. 10 illustrates a computing system 1000 that is arranged in a point-to-point (PtP) configuration according to an embodiment. In particular, FIG. 10 shows a system where processors, memory, and input/output devices are interconnected by a number of point-to-point interfaces. Generally, one or more of the computing systems described herein may be configured in the same or similar manner as computing system 1000.

Processors 1070 and 1080 may also each include integrated memory controller logic (MC) 1072 and 1082 to communicate with memory elements 1032 and 1034. In alternative embodiments, memory controller logic 1072 and 1082 may be discrete logic separate from processors 1070 and 1080. Memory elements 1032 and/or 1034 may store various data to be used by processors 1070 and 1080 in achieving operations and functionality outlined herein.

Processors 1070 and 1080 may be any type of processor, such as those discussed in connection with other figures. Processors 1070 and 1080 may exchange data via a point-to-point (PtP) interface 1050 using point-to-point interface circuits 1078 and 1088, respectively. Processors 1070 and 1080 may each exchange data with a chipset 1090 via individual point-to-point interfaces 1052 and 1054 using point-to-point interface circuits 1076, 1086, 1094, and 1098. Chipset 1090 may also exchange data with a co-processor 1038, such as a high-performance graphics circuit, machine learning accelerator, or other co-processor 1038, via an interface 1039, which could be a PtP interface circuit. In alternative embodiments, any or all of the PtP links illustrated in FIG. 10 could be implemented as a multi-drop bus rather than a PtP link.

Chipset 1090 may be in communication with a bus 1020 via an interface circuit 1096. Bus 1020 may have one or more devices that communicate over it, such as a bus bridge 1018 and I/O devices 1016. Via a bus 1010, bus bridge 1018 may be in communication with other devices such as a user interface 1012 (such as a keyboard, mouse, touchscreen, or other input devices), communication devices 1026 (such as modems, network interface devices, or other types of communication devices that may communicate through a computer network 1060), audio I/O devices 1016, and/or a data storage device 1028. Data storage device 1028 may store code 1030, which may be executed by processors 1070 and/or 1080. In alternative embodiments, any portions of the bus architectures could be implemented with one or more PtP links.

The computer system depicted in FIG. 10 is a schematic illustration of an embodiment of a computing system that may be utilized to implement various embodiments discussed herein. It will be appreciated that various components of the system depicted in FIG. 10 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any embodiments or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The following examples pertain to embodiments in accordance with this Specification. It will be understood that certain examples may be combined with certain other examples, in certain embodiments.

Example 1 includes an apparatus comprising: a circuit board comprising circuitry; and fins extending from at least one outer edge of the circuit board, wherein a thickness of the fins is less than a thickness of the circuit board and the fins comprise electrical connectors connected to the circuitry of the circuit board.

Example 2 includes the subject matter of Example 1, wherein the fins extend from two or more outer edges of the circuit board.

Example 3 includes the subject matter of Example 1 or 2, wherein the fins extend from each outer edge of the circuit board.

Example 4 includes the subject matter of any one of Examples 1-3, wherein the circuit board defines the fins.

Example 5 includes the subject matter of any one of Examples 1-4, wherein a top surface of the circuit board defines a top surface of the fins.

Example 6 includes the subject matter of any one of Examples 1-5, wherein the fins are shaped to provide an interlocking connection with another circuit board in the planar direction of the circuit board.

Example 7 includes the subject matter of Example 6, wherein the fins are substantially trapezoidal in shape.

Example 8 includes the subject matter of Example 6, wherein the fins are substantially circular in shape.

Example 9 includes the subject matter of any one of Examples 1-7, wherein the electrical connectors comprise one or more of plated through holes (PTHs), metal traces, and angled pins extending from the fins.

Example 10 includes an apparatus comprising: a circuit board comprising circuitry and defining recesses along an edge of the circuit board, wherein a thickness of the recesses is less than a thickness of the circuit board and the recesses comprise electrical connectors connected to the circuitry of the circuit board.

Example 11 includes the subject matter of Example 10, wherein the recesses are defined along an outer edge of the circuit board.

Example 12 includes the subject matter of Example 10 or 11, wherein the circuit board defines an opening and the recesses are defined along edges of the opening in the circuit board.

Example 13 includes the subject matter of Examples 10-12, wherein the recesses are shaped to provide an interlocking connection with another circuit board in the planar direction of the circuit board Example 14 includes the subject matter of Example 13, wherein the recesses are substantially trapezoidal in shape.

Example 15 includes the subject matter of Example 13, wherein the recesses are substantially circular in shape.

Example 16 includes the subject matter of any one of Examples 10-15, wherein the electrical connectors comprise one or more of plated through holes (PTHs), metal traces, and angled pins extending from surfaces defining the recesses.

Example 17 includes a system comprising: a first circuit board comprising circuitry and defining recesses along an edge of the first circuit board, wherein a thickness of the recesses is less than a thickness of the circuit board and the recesses comprise electrical connectors connected to the circuitry of the circuit board; and a second circuit board comprising circuitry and defining fins extending from at least one outer edge of the second circuit board, wherein a thickness of the fins is less than a thickness of the circuit board and the fins comprise electrical connectors connected to the circuitry of the circuit board; wherein the first and second circuit boards are substantially co-planar and the fins of the second circuit board are positioned within the recesses of the second circuit board.

Example 18 includes the subject matter of Example 17, wherein the first and second circuit boards are substantially the same thickness, and a combined thickness of the fins and recesses is substantially equal to the thickness of the first and second circuit boards.

Example 19 includes the subject matter of Example 17 or 18, wherein the fins and recesses are shaped to provide an interlocking connection of the first and second circuit boards in the co-planar direction.

Example 20 includes the subject matter of Example 19, wherein the fins and recesses are substantially trapezoidal in shape.

Example 21 includes the subject matter of Example 19, wherein the fins and recesses are substantially circular in shape.

Example 22 includes the subject matter of any one of Examples 17-21, wherein certain fins define holes, and the system further comprises screws within the holes to secure the second circuit board to the first circuit board.

Example 23 includes the subject matter of Example 22, further comprising a plate positioned over the fins and secured by the screws.

Example 24 includes the subject matter of any one of Examples 17-23, wherein the electrical connectors comprise one or more of plated through holes (PTHs), metal traces, and angled pins.

Example 25 includes the subject matter of any one of Examples 17-24, wherein the circuitry of the second circuit board includes one or more of a processor and memory.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. An apparatus comprising:
   a circuit board comprising circuitry; and
   fins extending from at least one outer edge of the circuit board, wherein a thickness of the fins is less than a thickness of the circuit board, the fins comprise electrical connectors connected to the circuitry of the circuit board, and the fins are shaped to provide an interlocking connection with another circuit board in the planar direction of the circuit board.

2. The apparatus of claim 1, wherein the fins extend from two or more outer edges of the circuit board.

3. The apparatus of claim 1, wherein the fins extend from each outer edge of the circuit board.

4. The apparatus of claim 1, wherein the circuit board defines the fins.

5. The apparatus of claim 1, wherein a top surface of the circuit board defines a top surface of the fins.

6. The apparatus of claim 1, wherein the fins are substantially trapezoidal in shape.

7. The apparatus of claim 1, wherein the fins are substantially circular in shape.

8. The apparatus of claim 1, wherein the electrical connectors comprise one or more of plated through holes (PTHs), metal traces, and angled pins extending from the fins.

9. An apparatus comprising:
   a circuit board comprising circuitry and defining recesses along an edge of the circuit board, wherein a thickness of the recesses is less than a thickness of the circuit board, the recesses comprise electrical connectors connected to the circuitry of the circuit board, and the recesses are shaped to provide an interlocking connection with another circuit board in the planar direction of the circuit board.

10. The apparatus of claim 9, wherein the recesses are defined along an outer edge of the circuit board.

11. The apparatus of claim 9, wherein the circuit board defines an opening and the recesses are defined along edges of the opening in the circuit board.

12. The apparatus of claim 9, wherein the recesses are substantially trapezoidal in shape.

13. The apparatus of claim 9, wherein the recesses are substantially circular in shape.

14. The apparatus of claim 9, wherein the electrical connectors comprise one or more of plated through holes (PTHs), metal traces, and angled pins extending from surfaces defining the recesses.

15. A system comprising:
    a first circuit board comprising circuitry and defining recesses along an edge of the first circuit board, wherein a thickness of the recesses is less than a thickness of the circuit board and the recesses comprise electrical connectors connected to the circuitry of the circuit board; and
    a second circuit board comprising circuitry and defining fins extending from at least one outer edge of the second circuit board, wherein a thickness of the fins is less than a thickness of the circuit board and the fins comprise electrical connectors connected to the circuitry of the circuit board;
    wherein the first and second circuit boards are substantially co-planar, the fins of the second circuit board are positioned within the recesses of the second circuit board, and the fins and recesses are shaped to provide an interlocking connection of the first and second circuit boards in the co-planar direction.

16. The system of claim 15, wherein the first and second circuit boards are substantially the same thickness, and a combined thickness of the fins and recesses is substantially equal to the thickness of the first and second circuit boards.

17. The system of claim 15, wherein the fins and recesses are substantially trapezoidal in shape.

18. The system of claim 15, wherein the fins and recesses are substantially circular in shape.

19. The system of claim 15, wherein certain fins define holes, and the system further comprises screws within the holes to secure the second circuit board to the first circuit board.

20. The system of claim 19, further comprising a plate positioned over the fins and secured by the screws.

21. The system of claim 15, wherein the electrical connectors comprise one or more of plated through holes (PTHs), metal traces, and angled pins.

22. The system of claim 15, wherein the circuitry of the second circuit board includes one or more of a processor and memory.

* * * * *